United States Patent
Huang et al.

(10) Patent No.: US 6,875,664 B1
(45) Date of Patent: Apr. 5, 2005

(54) FORMATION OF AMORPHOUS CARBON ARC STACK HAVING GRADED TRANSITION BETWEEN AMORPHOUS CARBON AND ARC MATERIAL

(75) Inventors: Richard J. Huang, Cupertino, CA (US); Srikanteswara Dakshina-Murthy, Austin, TX (US); Philip A. Fisher, Foster City, CA (US); Cyrus E. Tabery, Sunnyvale, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 152 days.

(21) Appl. No.: 10/230,794

(22) Filed: Aug. 29, 2002

(51) Int. Cl.[7] .............................................. H01L 21/336
(52) U.S. Cl. ...................................... 438/299; 438/736
(58) Field of Search ................................. 438/197, 299, 438/684, 694, 695, 696, 697, 698, 699, 717, 725, 734, 735, 736, 198, 199, 200; 257/437, 438, 500

(56) References Cited

U.S. PATENT DOCUMENTS

| | | | |
|---|---|---|---|
| 5,185,293 A | 2/1993 | Franke et al. | |
| 5,656,128 A | 8/1997 | Hashimoto et al. | |
| 5,679,608 A | 10/1997 | Cheung et al. | |
| 5,721,090 A | 2/1998 | Okamoto et al. | |
| 5,759,746 A | 6/1998 | Azuma et al. | |
| 5,981,398 A | 11/1999 | Tsai et al. | |
| 6,030,541 A | 2/2000 | Adkisson et al. | |
| 6,140,200 A | 10/2000 | Eldridge | |
| 6,277,757 B1 * | 8/2001 | Lin ............................ | 438/704 |
| 6,350,390 B1 | 2/2002 | Liu et al. | |
| 6,365,320 B1 | 4/2002 | Foote et al. | |
| 6,368,924 B1 | 4/2002 | Mancini et al. | |
| 6,388,924 B1 | 5/2002 | Nasu | |
| 6,413,852 B1 | 7/2002 | Grill et al. | |
| 6,573,030 B1 | 6/2003 | Fairbairn et al. | |
| 6,573,573 B2 * | 6/2003 | Lee ............................ | 257/390 |
| 6,596,553 B1 | 7/2003 | Lin et al. | |
| 6,673,684 B1 | 1/2004 | Huang et al. | |
| 2002/0074552 A1 * | 6/2002 | Weeks, Jr. et al. | |
| 2004/0023502 A1 * | 2/2004 | Tzou et al. | |

OTHER PUBLICATIONS

Wolf, S., Tauber, R. N., "Silicon Processing For the VLSI Era", Lattice Press, Sunset Beach, CA; 1986; pp. 322, 384–385, 556–557.

U.S. Appl. No. 10/277,760, entitled "Sacrificial Air Gap Layer for Insulation of Metals", as filed on Aug. 8, 2002, including claims, drawings, and abstract (17 pages).

(Continued)

*Primary Examiner*—Long Pham
*Assistant Examiner*—Dana Farahani
(74) *Attorney, Agent, or Firm*—Foley & Lardner LLP (57) ABSTRACT

A method of forming an integrated circuit using an amorphous carbon hard mask involves providing an amorphous carbon material layer above a layer of conductive material and providing an anti-reflective coating (ARC) material layer above the amorphous carbon material. A transition region is formed intermediate the amorphous carbon material layer and the ARC material layer. The transition region has a concentration profile that provides a transition between the amorphous carbon material layer and the ARC material layer. A portion of the amorphous carbon material layer, the ARC material layer, and the transition region is removed to form a hard mask, and a feature is formed in the layer of conductive material according to the hard mask.

20 Claims, 5 Drawing Sheets

OTHER PUBLICATIONS

U.S. Appl. No. 10/244,650, entitled "Use of Multilayer Amorphous Carbon Arc Stack to Eliminate Line Warpage Phenomenon", as filed on Sep. 16, 2002, including claims, drawings, and abstract (30 pages).

U.S. Appl. No. 10/217,730, entitled "Ion Implantation to Modulate Amorphous Carbon Stress", as filed on Aug. 13, 2002, including claims, drawings, and abstract (29 pages).

U.S. Appl. No. 10/424,420, entitled "Use of Amorphous Carbon for Gate Patterning", filed Apr. 28, 2003, by Fisher et al.

U.S. Appl. No. 10/230,775, entitled "Use of Buffer Dielectric Layer with Amorphous Carbon Mask to Reduce Line Warpage", as filed on Aug. 29, 2002, including claims, drawings, and abstract (28 pages).

U.S. Appl. No. 10/335,726, entitled "Use of Diamond as a Hard Mask Material", as filed on Jan. 2, 2003, including claims, drawings, and abstract (26 pages).

U.S. Appl. No. 10/424,675, entitled "Selective Stress–Inducing Implant and Resulting Pattern Distortion in Amorphous Carbon Patterning", as filed on Apr. 28, 2003, including claims, drawings, and abstract (28 pages).

U.S. Appl. No. 10/445,129, entitled "Modified Film Stack and Patterning Strategy for Stress Compensation and Prevention of Pattern Distortion in Amorphous Carbon Gate Patterning", as filed on May 20, 2003, including claims, drawings, and abstract (29 pages).

U.S. Appl. No. 10/215,173, entitled "Use of Amorphous Carbon Hand Mask for Gate Patterning to Eliminate Requirement of Poly Re–Oxidation", as filed Aug. 8, 2002, including claims, drawings, and abstract (29 pages).

* cited by examiner

FORMATION OF AMORPHOUS CARBON ARC STACK HAVING GRADED TRANSITION BETWEEN AMORPHOUS CARBON AND ARC MATERIAL

CROSS-REFERENCE TO RELATED PATENT APPLICATIONS

This application is related to U.S. patent application Ser. No. 10/215,173 entitled "Use of Amorphous Carbon Hard Mask for Gate Patterning to Eliminate Requirement of Poly Re-Oxidation," U.S. patent application Ser. No. 10/277,760 entitled "Sacrificial Air Gap Layer for Insulation of Metals," U.S. patent application Ser. No. 10/244,650 entitled "Use of Multilayer Amorphous Carbon Hard Mask to Eliminate Line Warpage Phenomenon," U.S. patent application Ser. No. 10/424,420 entitled "Use of Amorphous Carbon for Gate Patterning," U.S. patent application Ser. No. 10/217,730 entitled "Ion Implantation to Modulate Amorphous Carbon Stress," U.S. patent application Ser. No. 10/335,726 entitled "Use of Diamond as a Hard Mask Material," U.S. patent application Ser. No. 10/424,675 entitled "Selective Stress-Inducing Implant and Resulting Pattern Distortion in Amorphous Carbon Patterning," U.S. patent application Ser. No. 10/230,775 entitled "Use of Buffer Dielectric Layer with Amorphous Carbon Mask to Reduce Line Warpage," and U.S. patent application Ser. No. 10/445,129 entitled "Modified Film Stack and Patterning Strategy for Stress Compensation and Prevention of Pattern Distortion in Amorphous Carbon Gate Patterning," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive or tensile stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics. Further, the warpage can affect the operation of the device due to the varying width of the gate conductor.

Yet another issue relates to the adhesion between the mask material and a cap layer formed over the mask material. In certain situations, it may be desirable to provide an anti-reflective coating (ARC) layer over the mask material. Where there is a stress mismatch between the ARC layer and the mask material, adhesion between the layers may be adversely affected (e.g., the ARC layer may "delaminate" or pull away from the underlying mask material).

Yet still another issue relates to the formation of defects in the cap layer. For example, small holes or apertures ("pinholes") may form in the cap layer. In cases where a photoresist mask is applied above the cap layer, chemicals from the photoresist deposition or removal process may seep through the pinholes and adversely affect the underlying mask material, such as by deforming or eroding a portion of the mask material.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use amorphous carbon as a mask in the formation of integrated circuit structures. Even further still, there is a need for a cap layer that resists the formation of pinhole defects and that provides adequate adhesion between the cap layer and an underlying mask material. Yet further still, there is a need for a method of fabrication that forms structures having reduced critical dimensions, that improves the shape integrity of structures formed, that uses a mask including amorphous carbon, and that uses a cap layer that resists the formation of pinhole defects and provides adequate adhesion between the cap layer and an underlying mask material.

SUMMARY OF THE INVENTION

An exemplary embodiment relates to a method of forming an integrated circuit using an amorphous carbon hard mask. The method includes providing an amorphous carbon material layer above a first layer of material, forming a transition region above the amorphous carbon material layer, and providing an anti-reflective coating (ARC) material layer above the transition region. The transition region has a concentration profile that provides a transition between the amorphous carbon material layer and the ARC material layer. The method also includes removing a portion of the amorphous carbon material layer, the ARC material layer, and the transition region to form a hard mask and forming a feature in the layer of conductive material according to the hard mask.

Another exemplary embodiment relates to a method of forming features in an integrated circuit. The method includes forming a mask above a first layer of material. The mask comprises a first region including amorphous carbon, a second region provided above the first region and including an anti-reflective coating (ARC) material, and a third region intermediate the first and second regions comprising both amorphous carbon and ARC material. The method also includes forming a feature in the first layer of material according to the mask and removing the mask.

A further exemplary embodiment relates to an integrated circuit produced by a method that includes providing a conductor or semiconductor material layer above a semiconductor substrate. The method also includes depositing a layer of amorphous carbon material above the layer of conductor or semiconductor material, depositing a layer of anti-reflective coating (ARC) material above the layer of conductor or semiconductor material, and forming a transition layer between the amorphous carbon and the ARC layer. The transition layer comprises amorphous carbon material and ARC material and has a concentration profile that varies between the layer of amorphous carbon and the layer of ARC material. The method further includes etching the amorphous carbon layer, the ARC layer, and the transition layer to form an amorphous carbon ARC stack and etching the layer of conductor or semiconductor material according to the amorphous carbon ARC stack.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
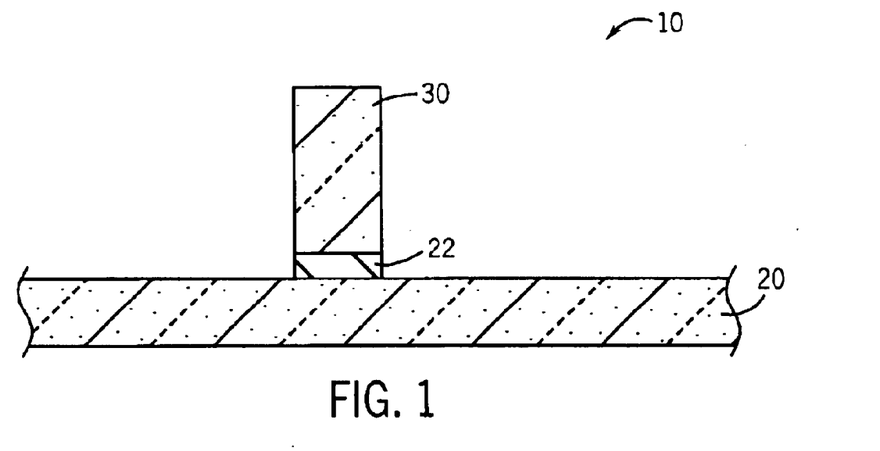
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 500 and 2000 angstroms and a width of between approximately 30 and 50 nanometers.

Figure 2A:
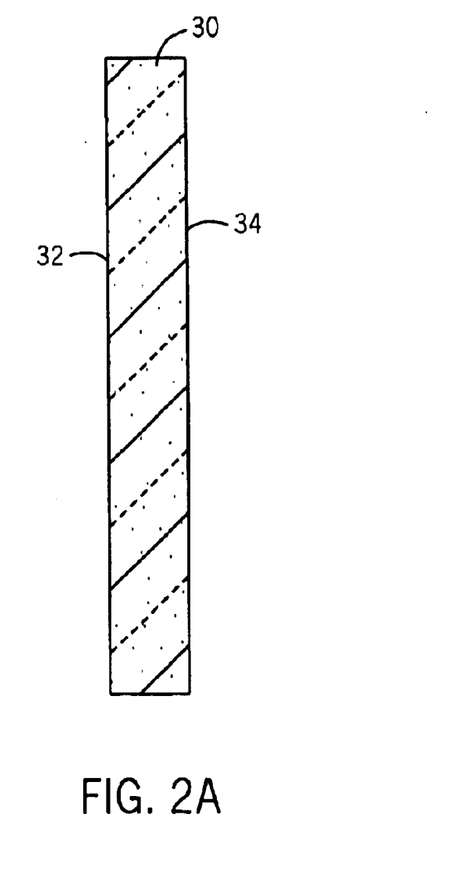
FIG. 2A is a top elevation view of the integrated circuit portion shown in FIG. 1 showing a feature formed without warpage.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

Figure 2B:
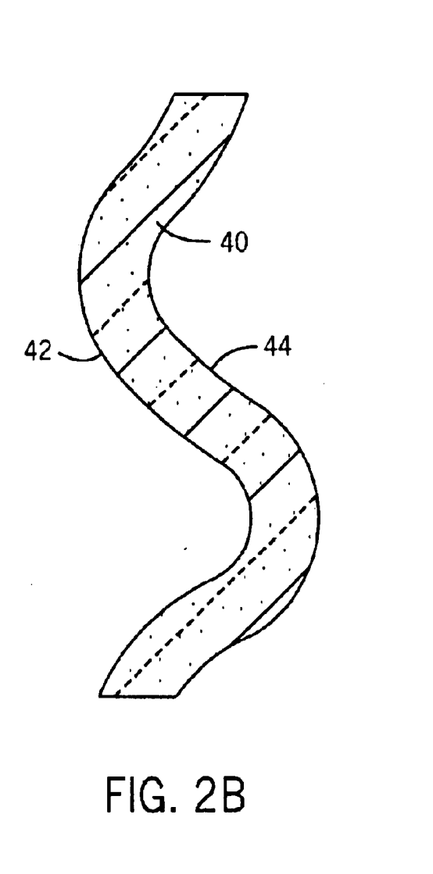
FIG. 2B is a top elevation view of a feature similar to that shown in FIG. 2A showing a warpage phenomenon.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others. Preferably, conductive line 30 deviates in width less than 2 percent of its largest width.

One material that may be used as a hard mask in the formation of integrated circuit structures having reduced critical dimensions (e.g., approximately 30–50 nanometers or less) is amorphous carbon. It has been discovered that when a layer of amorphous carbon material is patterned to provide a hard mask for features having reduced critical dimensions, shape integrity may be impaired due to the internal properties of the amorphous carbon material. One theory currently being investigated is that internal stresses (e.g., compressive or tensile stresses) in the amorphous carbon material cause the mask to deform. For example, where a layer of amorphous carbon is patterned to form a mask for a conductive line to be formed in a material underlying the mask, a cap layer or anti-reflective coating (ARC) layer may be provided above the amorphous carbon pattern. When this cap or ARC layer is removed, stresses in the amorphous carbon material may cause the mask to buckle or deform to produce a wavy or serpentine pattern. This serpentine pattern is transferred to the conductive line material in a subsequent etching step.

A method for producing portion 10 that reduces or eliminates warpage in the formation of conductive line 30 is described below with reference to FIGS. 3 to 8. FIG. 9 is a flow diagram that outlines the process 200 used in the formation of portion 10.

Figure 3:
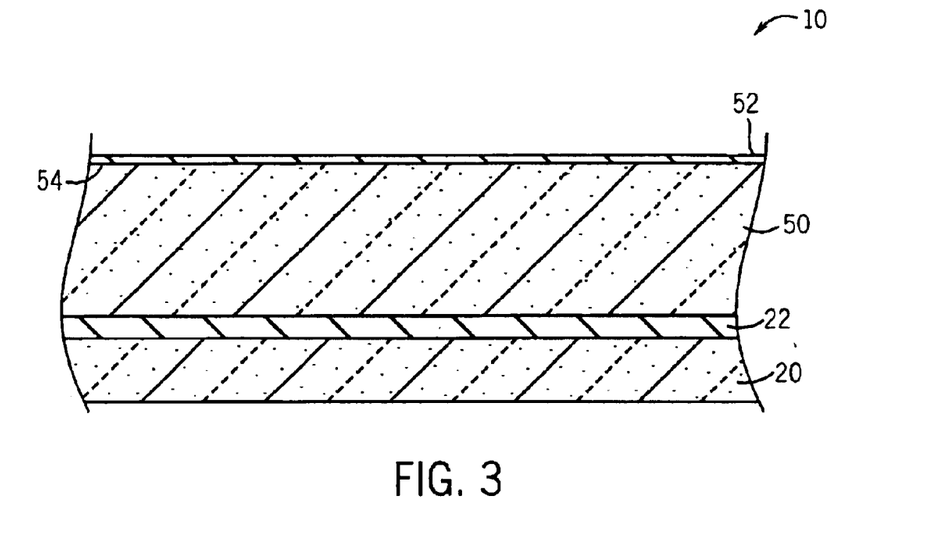
FIG. 3 is a schematic cross-sectional view of the portion shown in FIG. 1 illustrating a polysilicon deposition step.

In a step 210 (FIG. 9) illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, high-k gate dielectrics, etc.). In an exemplary embodiment, layer 50 is polysilicon and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,500 and 2,000 angstroms and layer 22 has a thickness of between approximately 7 and 15 angstroms. In an alternative embodiment, layer 50 has a thickness of between approximately 1,000 and 2,500 angstroms and layer 22 has a thickness of between approximately 10 and 20 angstroms.

When polysilicon layer 50 is formed, a thin layer 52 of oxide forms on the top or upper surface 54 of polysilicon layer 50. Oxide layer 52 may be referred to as a "native" oxide layer. The thickness of oxide layer 52 may vary depending on various processing conditions. In an exemplary embodiment, the thickness of oxide layer 52 is between approximately 10 and 20 angstroms.

Figure 4:
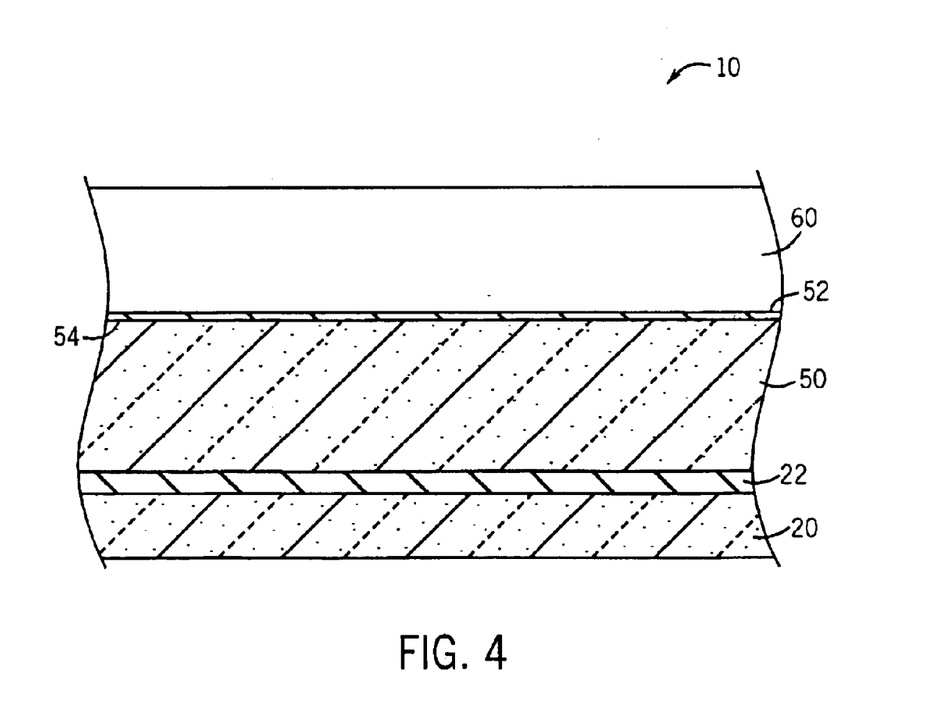
FIG. 4 is a schematic cross-sectional view of the portion shown in FIG. 1 illustrating an amorphous carbon layer deposition step.

In a step 220 shown in FIG. 4, a layer or film 60 of amorphous carbon material is deposited above or over polysilicon layer 50. Layer 60 is deposited in a plasma-enhanced chemical vapor deposition (PECVD) process using an atmosphere of hydrocarbon such as ethylene, propylene, methane, and the like. The PECVD process is performed at a temperature of between approximately 400 and 550° C. and a pressure of between approximately 5 and 10 torr with a plasma power of between approximately 800 and 1,500 watts.

In a preferred embodiment, amorphous carbon layer 60 has a thickness of between approximately 500 and 700 angstroms. In alternative embodiments, the thickness of amorphous carbon layer 60 may vary depending on various design considerations. For example, the amorphous carbon layer may have a thickness of less than 500 angstroms (e.g., between 300 and 500 angstroms or less). In another alternative embodiment, the amorphous carbon layer may have a thickness of greater than 700 angstroms (e.g., between 700 and 900 angstroms or greater).

One advantageous feature of providing an amorphous carbon layer that may be produced with various thicknesses is that the amorphous carbon layer may be produced in a thickness suitable for patterning polysilicon layer 50. For example, where a particular thickness of polysilicon is provided, the thickness of the amorphous carbon layer may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above polysilicon layer 50 in a pure or undoped form. In an alternative embodiment, the amorphous carbon layer may be deposited with nitrogen (or another species, such as helium (He), argon (Ar), neon (Ne), krypton (Kr), xenon (Xe), and radon (Rn)) incorporated therein. For example, the amorphous carbon layer as deposited may include between approximately 0 and 10 atomic percent nitrogen. To deposit a nitrogen-containing amorphous carbon layer, a PECVD process using an atmosphere of hydrocarbon and nitrogen is used. To achieve a doping concentration of approximately 6 atomic percent nitrogen, for example, a flow ratio approximately 1:10 is used for the hydrocarbon to nitrogen gas flow rate (e.g., 300 cubic centimeters of hydrocarbon per minute to 3 liters of nitrogen per minute). In alternative embodiments, various other nitrogen concentrations may be achieved by varying the various processing conditions (e.g., increasing or decreasing the gas flow ratio of nitrogen, etc.).

In another alternative embodiment, only a portion of the amorphous carbon layer is doped. For example, a top portion of the amorphous carbon layer may be doped with nitrogen, while a bottom portion of the amorphous carbon layer may comprise pure or undoped amorphous carbon. In another example, the amorphous carbon layer may include alternating layers of nitrogen-doped and undoped amorphous carbon material.

To facilitate the description below, amorphous carbon layer 60 will be described with reference to the preferred embodiment described above, in which a layer of amorphous carbon is deposited in pure form (i.e., without nitrogen or other ions being incorporated therein). It should be understood to one of skill in the art that the amorphous carbon layer may be formed in any of a variety of ways depending on the desired amorphous carbon layer properties, as described above with regard to the various alternative embodiments.

Figure 5:
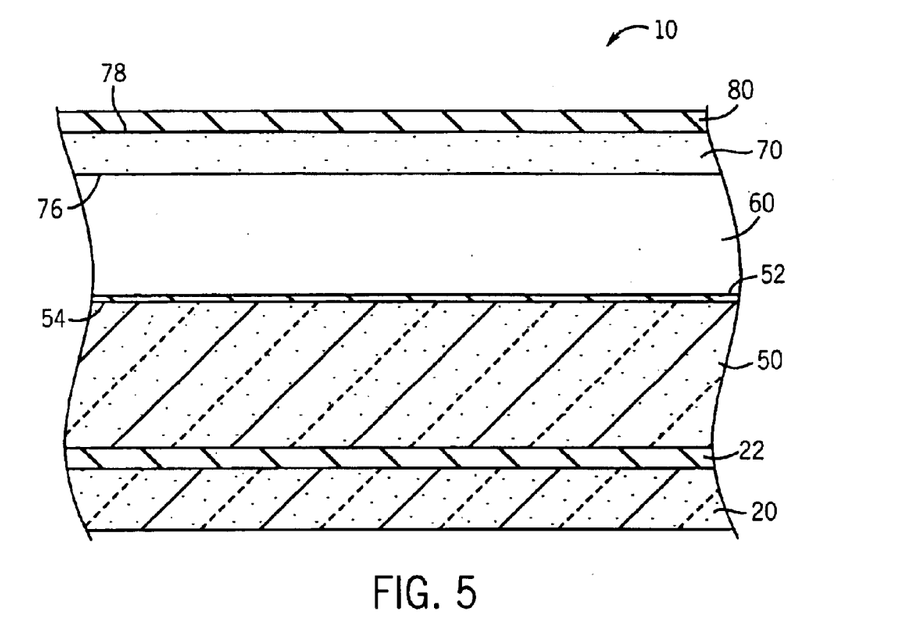
FIG. 5 is a schematic cross-sectional view of the portion shown in FIG. 1 illustrating an anti-reflective coating (ARC) layer and transition layer formation step.

In a step 240 (FIG. 9), shown in FIG. 5, a cap layer 80 is deposited above amorphous carbon layer 60. Cap layer 80 may be formed of an anti-reflective material to form an anti-reflective coating (ARC) layer. ARC layer 80 may include silicon nitride (SiN), silicon oxynitride (SiON), silicon-rich oxide (e.g., non-stoichiometric oxide-containing silicon material), silicon-rich nitride, and the like. In an exemplary embodiment, ARC layer 80 has a thickness of between approximately 200 and 250 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be prevented.

Prior to deposition of cap layer 80, in a step 230 shown in FIG. 5, a transition layer or region 70 is formed. Transition region 70 provides a gradual or "graded" transition between amorphous carbon layer 60 and cap layer 80, and is formed intermediate or between amorphous carbon layer 60 and cap layer 80. Transition region 70 is comprised of the materials used to form amorphous carbon layer 60 and cap layer 80, and has a concentration profile that varies between amorphous carbon layer 60 and cap layer 80.

In an exemplary embodiment, the concentration of cap layer material in transition region 70 varies from between approximately 0 and 10 atomic percent adjacent to amorphous carbon layer 60 to between approximately 90 and 100 atomic percent adjacent to cap layer 80. For example, where cap layer 80 is made of silicon oxynitride, the concentration of silicon oxynitride in transition region 70 may increase from approximately 0 percent at an interface 76 between amorphous carbon layer 60 and transition region 70 to approximately 100 percent at an interface 78 between transition region 70 and cap layer 80. The concentration of amorphous carbon in transition region 70 varies in the opposite direction, such that the concentration of amorphous carbon is approximately 0 percent at interface 78 and approximately 100 percent at interface 76.

The specific concentration profile may vary in different embodiments. For example, in one embodiment, the concentration profile may vary between the interfaces 76, 78 in a linear fashion (e.g., concentration increases the same amount per unit distance between interfaces 76 and 78). In this example, the concentration of each constituent would be approximately 50 percent at the midpoint of the transition region 70. In other embodiments, the concentration may increase in any of a variety of non-linear manners (e.g., concentration may vary with the square or cube of distance, or in any of a variety of other manners).

Additionally, while in a preferred embodiment the concentration of the constituents varies between 0 and 100 percent, in alternative embodiments, other concentration ranges may be provided. For example, the concentration of silicon oxynitride may range between 20 and 80 percent in the transition layer.

One advantageous feature of providing a transition layer 70 between cap layer 80 and amorphous carbon layer 60 is that adhesion between cap layer 80 and amorphous carbon layer 60 is improved. Because the transition between the materials forming the cap layer and amorphous carbon layer is gradual, as opposed to abrupt (e.g., where the cap layer is deposited directly adjacent to the amorphous carbon layer), the tendency for delamination or separation between the layers 60, 80 is reduced or eliminated.

Another advantageous feature of providing transition layer 70 between cap layer 80 and amorphous carbon layer 60 is damage to amorphous carbon layer 60 caused by pinhole defects which may form in cap layer 80 are reduced or eliminated. For example, because transition region separates the pure amorphous carbon layer from the cap layer, chemicals traversing the pinhole defects in the cap layer are not introduced directly into the amorphous carbon layer. Instead, the pinholes are constrained by the position of the transition layer to reduce or prevent the occurrence of pinhole defects that extend to the amorphous carbon layer. In this manner, damage to the amorphous carbon layer is reduced or eliminated.

A further advantageous feature of providing transition layer 70 between cap layer 80 and amorphous carbon layer 60 is that the amount of stress mismatch between adjacent layers may be reduced. For example, if amorphous carbon layer 60 includes an internal compressive stress and cap layer 80 includes an internal stress of a different magnitude (e.g., more or less compressive, tensile, etc.), the mismatch may affect adhesion between layers 60, 80 or otherwise negatively affect amorphous carbon layer 60.

In a preferred embodiment, transition region 70 is formed in a continual process that includes the deposition of amorphous carbon layer 60 and cap layer 80. Both amorphous carbon layer 60 and cap layer 80 are deposited in a PECVD process. As described above, amorphous carbon layer 60 is deposited using a gas phase comprising hydrocarbons at a temperature of between approximately 400° and 550° C. and a pressure of between approximately 5 and 10 torr with a plasma power of between approximately 500 and 1,500 watts. In an exemplary embodiment where cap layer 80 is made of SiON, cap layer 80 is deposited using an atmosphere of $SiH_4/N_2O/N_2$ at a temperature of between 250° and 500° C. and a pressure of between approximately 2 and 7 torr with a plasma power of between approximately 50 and 500 watts.

To form transition layer 70, the processing conditions of deposition are gradually altered between the conditions used to form amorphous carbon layer 60 and cap layer 80. For example, the composition of the gas phase is gradually changed from the hydrocarbon used to form the amorphous carbon layer to $SiH_4/N_2O/N_2$ used to form the cap layer over a period of between approximately 5 and 15 seconds. This may be accomplished by altering the relative flow rates of the various gases used during deposition. For example, in an exemplary embodiment, the flow rate of hydrocarbon may be gradually decreased from 200 SCCM to 0 SCCM and the flow rate of $SiH_4/N_2O/N_2$ may be gradually increased from 0 SCCM to 100 SCCM.

In a preferred embodiment, the formation of amorphous carbon layer 60, transition region 70, and cap layer 80 may be accomplished in a single deposition chamber in which the deposition conditions are slowly transitioned between the conditions used to form an amorphous carbon layer and a cap layer. The result is a transition region that provides a concentration profile that gradually changes from amorphous carbon to cap layer material. In an exemplary embodiment, an AMAT Producer DXZ or other PECVD tools may be used to form amorphous carbon layer 60.

In a preferred embodiment, transition region 70 has a thickness of between approximately 10 and 50 angstroms. In alternative embodiments, the thickness of the transition region can be greater than 50 angstroms (e.g., up to a thickness of between approximately 100 and 150 angstroms).

Figure 6:
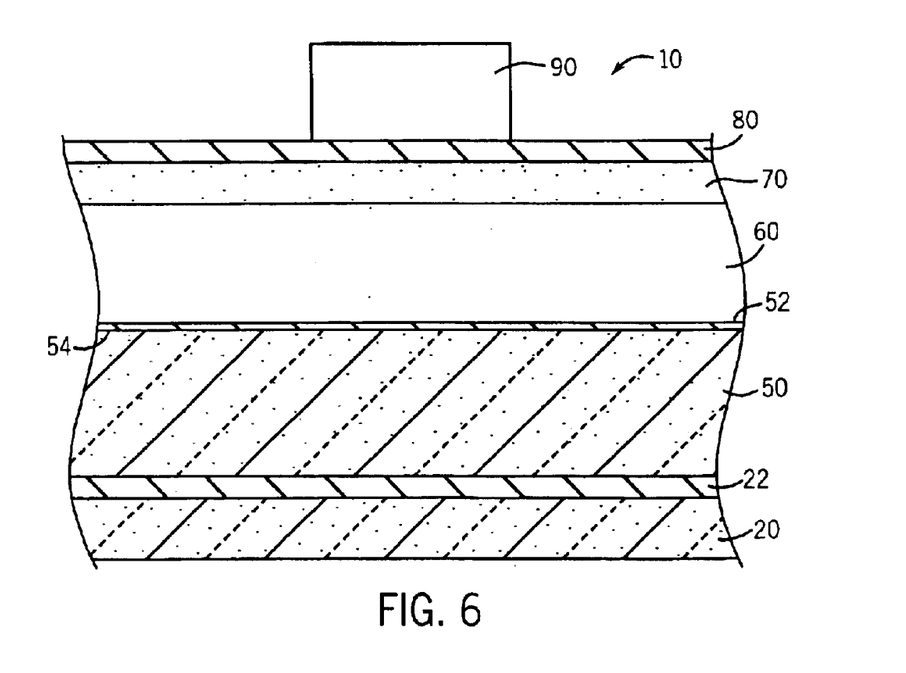
FIG. 6 is a schematic cross-sectional view of the portion shown in FIG. 1 illustrating a mask formation step.

In a step 250 shown in FIG. 6, a layer of photoresist material is deposited above or over cap layer 80 (e.g., by spin-coating) and exposed to form a photoresist feature 90. The layer of photoresist is deposited at a thickness of between approximately 2000 and 4000 angstroms and is patterned to have a width of between approximately 100 and 200 nanometers. Any of a variety of photoresist materials may be used, including photoresist materials that may be etched using UV rays having wavelengths of 193 or 248 nanometers.

Figure 7:
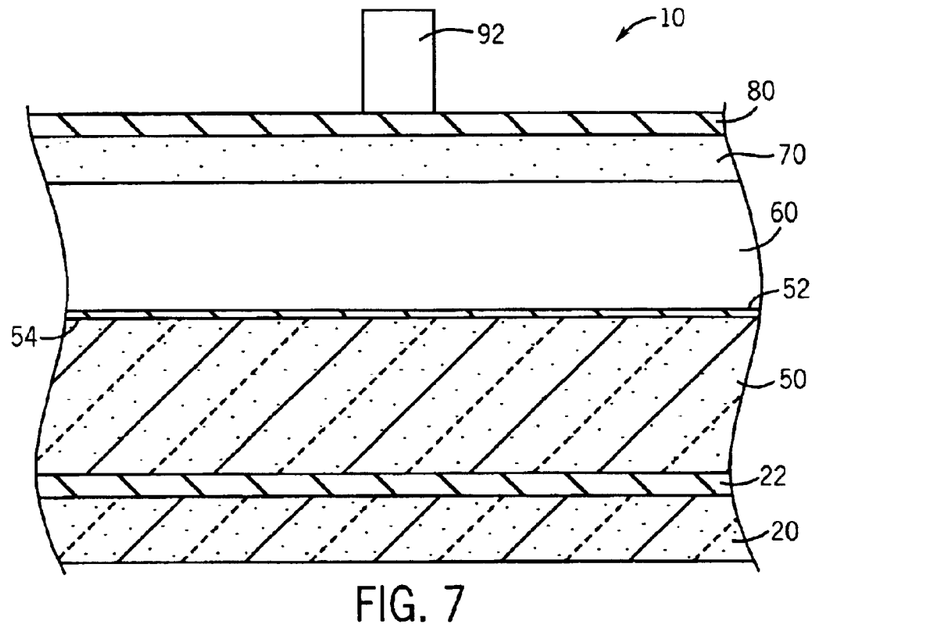
FIG. 7 is a schematic cross-sectional view of the portion shown in FIG. 1 illustrating a mask trimming step.

In a step 260 shown in FIG. 7, photoresist feature 90 is trimmed to form a photoresist mask 92 having reduced critical dimensions. Trimming is accomplished by oxidizing photoresist feature 90 and removing the oxidized portion, which results in a photoresist mask having reduced dimensions. The thickness of photoresist mask 92 may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques.

In an exemplary embodiment, photoresist mask 92 has a thickness of between approximately 2000 and 3000 angstroms and a width of between approximately 120 and 180 nanometers after trim etching. In alternative embodiments, photoresist mask may have a thickness of between approximately 2000 and 2500 angstroms and a width of approximately 120 and 150 angstroms.

Figure 8:
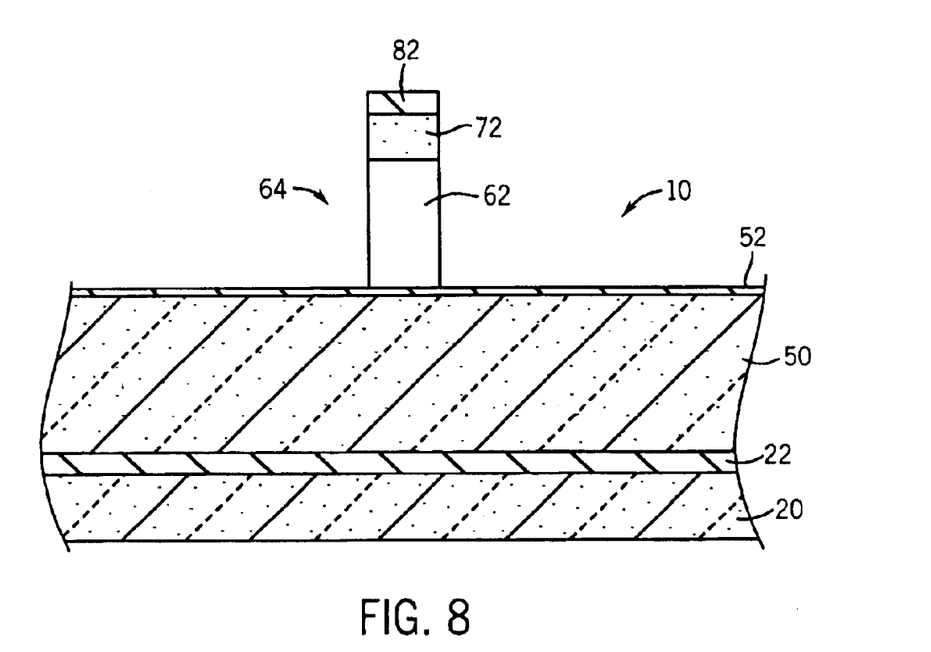
FIG. 8 is a schematic cross-sectional view of a portion shown in FIG. 1 illustrating the formation of an amorphous carbon mask feature.
Figure 9:
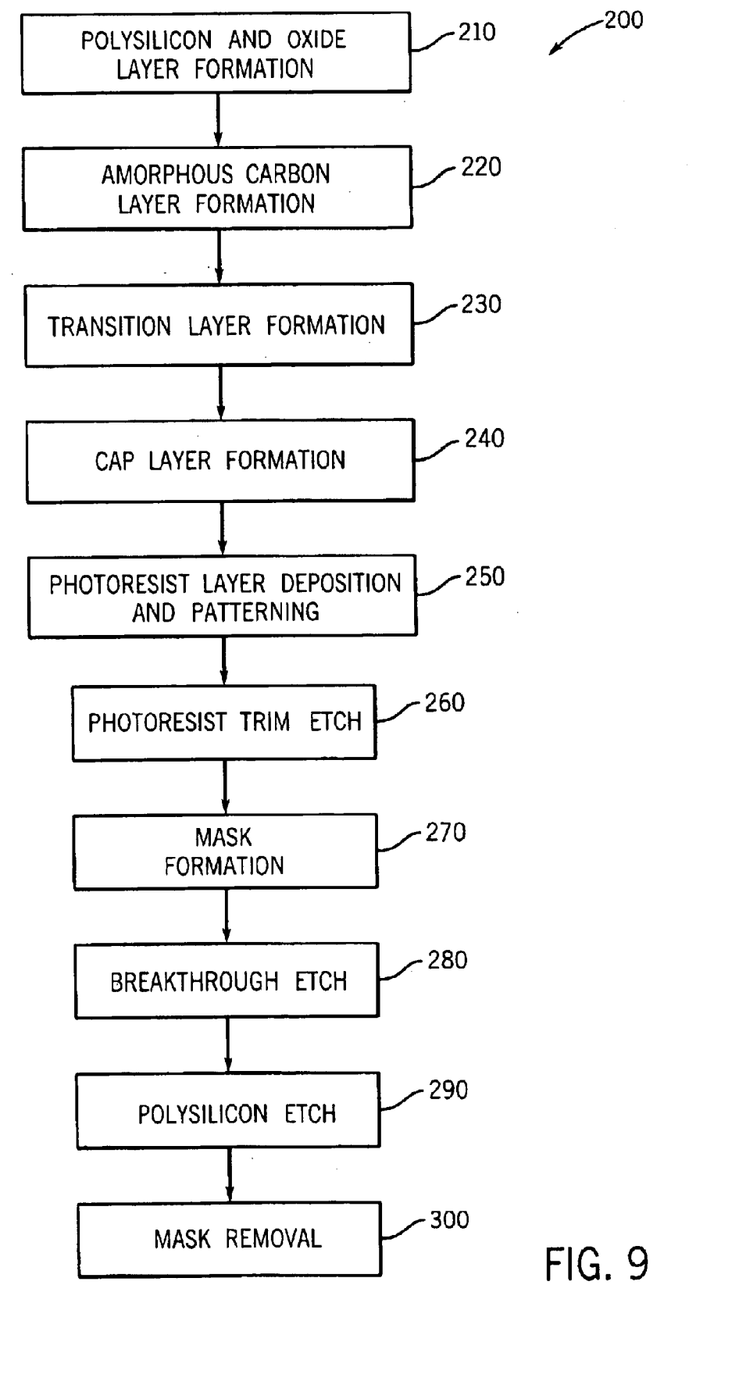
FIG. 9 is a flow diagram illustrating the process of forming structures in an integrated circuit.

In a step 270 shown in FIG. 8, photoresist mask 92 is used as a mask to pattern cap layer 80, transition layer 70, and amorphous carbon layer 60 to form a hard mask or mask 64 (e.g., an amorphous carbon ARC stack). In an exemplary embodiment, cap layer 80 is etched using a fluorine-based plasma (e.g., $CF_4$, $CF_4/CHF_3$, etc.) to form a cap feature 82. The etching is performed in an argon or helium atmosphere at a temperature of approximately between approximately 10° and 40° C. and a pressure of approximately 10 millitorr. Cap feature 82 is then used as a mask to pattern transition layer 70 and amorphous carbon layer 60 to form transition feature 72 and amorphous carbon feature 62. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

In a step 280, a breakthrough or native oxide removal etch is performed to remove oxide layer 52 from the surface of polysilicon layer 50 prior to patterning polysilicon layer 50. The breakthrough etch also removes any remaining photoresist and cap material located on top of cap layer 80. The breakthrough etch step is performed using the same conditions as described above with respect to the cap etch (e.g., using a fluorine-based plasma).

In a step 290, mask 64 is used to pattern or form features in polysilicon layer 50. For example, polysilicon layer 50 may be etched to form conductive line 30 (shown in FIG. 1). The polysilicon etch is performed using an $HBr/Cl_2/HeO_2/CF_4$ mixture at a temperature of between approximately 40 and 70° C. and a pressure of between approximately 3 and 10 millitorr.

In a step 300, mask 64 is removed after polysilicon layer 50 is patterned (e.g., to form conductive line 30 shown in FIG. 1). The constituents of mask 64 may be removed using methods similar to those described above. For example, the ARC portion of mask 64 may be removed using a fluorine-based plasma (e.g., $CF_4$, $CF_4/CHF_3$, etc.). The amorphous carbon portion of mask 64 may be removed using an oxygen-containing plasma to expose the top surface of conductive line 30. In subsequent processing steps, other material layers and devices may be added to portion 10 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A-method of forming an integrated circuit amorphous carbon hard mask, the method comprising:

providing an amorphous carbon material layer above a first layer of material;

forming a transition region above the amorphous carbon material layer;

providing an anti-reflective coating (ARC) material layer above the transition region;

wherein the transition region has a concentration profile that provides a transition between the amorphous carbon material layer and the ARC material layer;

removing a portion of the amorphous carbon material layer, the ARC material layer and the transition region to form a hard mask; and forming a feature in the layer of conductive material according to the hard mask.

2. The method of claim 1, wherein the steps of providing an amorphous carbon material layer and providing an ARC material layer comprise using a plasma-enhanced chemical vapor deposition (PECVD) process.

3. The method of claim 2, wherein the step forming a transition region comprises gradually adjusting the concentration of gases used in the PECVD process to deposit a transition region having a concentration profile that varies between the amorphous carbon material and the ARC material.

4. The method of claim 1, wherein the concentration profile of the transition region increases from between approximately 0 and 10 atomic percent ARC material adjacent the amorphous carbon layer to between approximately 90 to 100 atomic percent ARC material adjacent the ARC layer.

5. The method of claim 1, wherein the transition region has a thickness between approximately 10 and 50 angstroms.

6. The method of claim 1, wherein the amorphous carbon material layer includes a dopant that may be delivered in a gas phase.

7. The method of claim 1, wherein the ARC material layer comprises at least one of silicon nitride, silicon oxynitride, silicon-rich oxide, and silicon-rich nitride.

8. A method of forming features in an integrated circuit comprising:

forming a mask above a first layer of material, the mask comprising a first region including amorphous carbon, a second region provided above the first region and including an anti-reflective coating (ARC) material, and a third region intermediate the first and second regions comprising both amorphous carbon and ARC material;

forming a feature in the first layer of material according to the mask; and removing the mask.

9. The method of claim 8, wherein the third region includes a concentration profile that varies between the first region and the second region.

10. The method of claim 9, wherein the concentration of ARC material in the third region increases with increasing distance from the first region.

11. The method of claim 8, wherein the third region has a thickness of between approximately 10 and 50 angstroms.

12. The method of claim 8, wherein the ARC material is selected from silicon nitride, silicon oxynitride, silicon-rich oxide, and silicon-rich nitride.

13. The method of claim 8, wherein the step of forming a mask comprises depositing a layer of amorphous carbon, a layer of ARC material, and a layer of amorphous carbon and ARC material intermediate the amorphous carbon layer and the ARC material layer.

14. The method of claim 13, wherein the ARC material and the amorphous carbon material are deposited using a plasma-enhanced chemical vapor deposition (PECVD) process, and wherein the layer of ARC material and amorphous carbon is formed by adjusting the deposition conditions between the deposition conditions used for the amorphous carbon layer and the ARC material layer.

15. The method of claim 13, wherein the step of forming a mask comprises forming a photoresist mask above the ARC material layer and trimming the photoresist mask.

16. An integrated circuit produced by a method comprising:
   providing a conductor or semiconductor material layer above a semiconductor substrate;
   depositing a layer of amorphous carbon material above the layer of conductor or semiconductor material;
   depositing a layer of anti-reflective coating (ARC) material above the layer of conductor or semiconductor material;
   forming a transition layer between the amorphous carbon and the ARC layer, the transition layer comprising amorphous carbon material and ARC material and having a concentration profile that varies between the layer of amorphous carbon and the layer of ARC material;
   etching the amorphous carbon layer, the ARC layer, and the transition layer to form an amorphous carbon ARC stack; and
   etching the layer of conductor or semiconductor material according to the amorphous carbon ARC stack.

17. The method of claim 16, wherein the steps of depositing a layer of amorphous carbon material, depositing a layer of ARC material, and forming a transition layer comprise using a plasma-enhanced chemical vapor deposition process.

18. The method of claim 16, wherein the step of forming a transition layer includes adjusting a gas concentration in a deposition chamber.

19. The method of claim 18, wherein the amorphous carbon is doped with at least one of nitrogen and an inert ion and the a dopant and the ARC material comprises at least one of silicon nitride, silicon oxynitride, silicon-rich oxide, and silicon-rich nitride.

20. The method of claim 16, wherein the conductor or semiconductor material is polysilicon.

* * * * *